US010274511B2

(12) United States Patent
Malvern

(10) Patent No.: US 10,274,511 B2
(45) Date of Patent: Apr. 30, 2019

(54) ACCELEROMETERS

(71) Applicant: Atlantic Inertial Systems, Limited, Plymouth, Devon (GB)

(72) Inventor: Alan Malvern, Plymouth (GB)

(73) Assignee: ATLANTIC INERTIAL SYSTEMS, LIMITED, Devon (GB)

( * ) Notice: Subject to any disclaimer, the term of this patent is extended or adjusted under 35 U.S.C. 154(b) by 174 days.

(21) Appl. No.: 15/107,118

(22) PCT Filed: Dec. 11, 2014

(86) PCT No.: PCT/GB2014/053670
§ 371 (c)(1),
(2) Date: Jun. 22, 2016

(87) PCT Pub. No.: WO2015/097435
PCT Pub. Date: Jul. 2, 2015

(65) Prior Publication Data
US 2016/0334439 A1 Nov. 17, 2016

(30) Foreign Application Priority Data
Dec. 23, 2013 (GB) .................. 1322918.2

(51) Int. Cl.
*G01P 15/125* (2006.01)
*B81B 5/00* (2006.01)
(Continued)

(52) U.S. Cl.
CPC .............. *G01P 15/125* (2013.01); *B81B 5/00* (2013.01); *G01P 15/131* (2013.01); *G01P 2015/0814* (2013.01); *G01P 2015/0882* (2013.01)

(58) Field of Classification Search
CPC ................ G01P 15/125; G01P 15/131; G01P 2015/125; G01P 2015/131; G01P 2015/0814; G01P 2015/0882
(Continued)

(56) References Cited

U.S. PATENT DOCUMENTS 5,541,437 A * 7/1996 Watanabe ............. G01P 15/124
257/417
5,610,335 A * 3/1997 Shaw ................... B81B 3/0051
73/514.36
(Continued)

FOREIGN PATENT DOCUMENTS

EP 1718980 B1 6/2010
WO 2004076340 A1 9/2004
(Continued)

OTHER PUBLICATIONS

Authors: Babak Vakili Amini and Farrokh Ayazi, Title: Microgravity capacitive silicon-on-insulator accelerometers, Date: Sep. 23, 2005, Publisher: Institute of Physics Publishing, Journal of Micromechanics and Microengineering, vol. 15, pp. 2113-2120.*
(Continued)

*Primary Examiner* — Lisa Caputo
*Assistant Examiner* — Roger Hernandez-Prewit
(74) *Attorney, Agent, or Firm* — Cantor Colburn LLP

(57) ABSTRACT

A capacitive accelerometer including: at least one additional fixed capacitor electrode with a plurality of additional fixed capacitive electrode fingers extending along the sensing direction. The proof mass comprises a plurality of moveable capacitive electrode fingers extending from the proof mass along the sensing direction and arranged to interdigitate with the plurality of additional fixed capacitive electrode fingers of the at least one additional fixed capacitor electrode. A means is provided for applying a voltage to the at least one
(Continued)

additional fixed capacitor electrode to apply an electrostatic force to the plurality of moveable capacitive electrode fingers that acts to pull the proof mass towards the at least one further fixed capacitor electrode and thereby reduces the lateral spacings between the movable capacitive electrode fingers of the proof mass and the first and second sets of fixed capacitive electrode fingers that provide electrostatic forces for sensing purposes.

13 Claims, 4 Drawing Sheets

(51) Int. Cl.
  *G01P 15/13* (2006.01)
  *G01P 15/08* (2006.01)
(58) Field of Classification Search
  USPC .................................................... 73/514.32
  See application file for complete search history.

(56) References Cited

U.S. PATENT DOCUMENTS

| | | | |
|---|---|---|---|
| 5,618,989 | A | 4/1997 | Marek |
| 2005/0039530 | A1 | 2/2005 | Schellin et al. |
| 2005/0132805 | A1 | 6/2005 | Park et al. |
| 2006/0112765 | A1* | 6/2006 | Malvern .............. G01P 1/006 73/514.32 |
| 2009/0199637 | A1 | 8/2009 | Sugiura et al. |
| 2011/0296917 | A1 | 12/2011 | Reinmuth et al. |
| 2013/0125649 | A1 | 5/2013 | Simoni et al. |

FOREIGN PATENT DOCUMENTS

| | | |
|---|---|---|
| WO | 2005083451 A1 | 9/2005 |
| WO | 2006105314 A1 | 10/2006 |

OTHER PUBLICATIONS

Authors: Peng Qu and Hongwei Qu, Title: Design and Characterization of a Fully Differential MEMS Accelerometer Fabricated Using MetalMUMPs Technology, Date: May 2, 2013, Publisher: Sensors, vol. 13, pp. 5720-5736.*

Author: Jia Yu Chen, Title: Single- and dual-axis lateral capacitive accelerometers based on CMOS-MEMS technology, Date: Apr. 30, 2010, Publisher: University of Oslo, Department of informatics, pp. total 106.*

Great Britain Search Report for application No. GB1322918.2; dated Jun. 10, 2014, 5 pages.

PCT International Search Report and The Written Opinion of the International Searching Authority, or the Declaration for International Application No. PCT/GB2014/053670, dated Mar. 11, 2015, 14 pages.

* cited by examiner

ACCELEROMETERS

CROSS REFERENCE TO RELATED APPLICATIONS

This is a US National Stage of Application No. PCT/GB2014/053670, filed on Dec. 11, 2014, which claims the benefit of GB Application No. GB1322918.2 filed Dec. 23, 2013, the disclosures of which are incorporated herein by reference.

TECHNICAL FIELD

The present disclosure relates to accelerometers and accelerometer control methods, in particular in relation to capacitive accelerometers.

BACKGROUND

Accelerometers are electromechanical devices that can measure acceleration forces due to motion or vibration. Accelerometers are used in a wide variety of applications, including seismic sensing, vibration sensing, inertial sensing and tilt sensing. Electromagnetic force feedback accelerometers with closed loop electronics use a very low resonance frequency sensor which has a high sensitivity. Such accelerometers may be used for measurement, control and navigation e.g. in civil aerospace applications. In accelerometers such as the Q-flex series available from Honeywell, the resonance frequency of the sensor is typically about 10 Hz, which decouples the sensor from its support, and gives very low bias errors e.g. less than 15 mg. However, the use of electromagnetic coils is difficult to implement in a micro electromechanical systems (MEMS) structure, so these devices are relatively large and expensive.

Capacitive accelerometers are typically manufactured from silicon and fully implemented as MEMS devices, using electrostatic forces for closed loop operation. These accelerometers are smaller, cheaper and more reliable than equivalent electromagnetic devices. MEMS capacitive sensors combined with advanced electronics are replacing traditional geophones or seismometers for different types of seismic sensing. A typical seismic sensor available from Colibrys provides a g range of 1-5 g, combined with low noise and high resolution. These devices are sensitive to the low amplitude signals produced by natural vibrations. However there remains a need for a high sensitivity accelerometer, with a micro-g bias stability, but also a ±30 g range making it suitable for navigation as well as seismometery.

A typical MEMS capacitive accelerometer comprises a proof mass movably mounted relative to a support and sealed so that a gaseous medium trapped inside the device provides squeeze damping for the proof mass when it moves in a sensing direction in response to an acceleration being applied. There is typically provided a set of fixed electrodes and a set of movable electrodes attached to the proof mass, with differential capacitance between the electrodes being measured so as to detect deflection of proof mass. WO 2004/076340 and WO 2005/083451 provide examples of capacitive accelerometers comprising a plurality of interdigitated fixed and moveable electrode fingers extending substantially perpendicular to the sensing direction of the MEMS device. A pulse width modulation (PWM) technique may be used to control the voltage waveforms supplied to the fixed electrodes. An in-phase PWM waveform is applied to a first set of fixed electrode fingers while an anti-phase PWM waveform is applied to a second set of fixed electrode fingers. In such a PWM regime the mark/space ratio varies with applied acceleration and provides a linear measure of acceleration. In WO 2005/083451 a servo adjusts the time difference of the mark/space ratio of the PWM drive signals so as to linearise the output of the accelerometer with input acceleration. Variations in the sensor system, such as temperature variations and/or mechanical variations in the construction of the MEMS device, can change the lateral gap between the interdigitated electrode fingers. This may be compensated by varying the mark/space ratio, to maintain the proof mass at a null position at all times. The voltage Vcrit at this operating point determines the maximum acceleration g that can be detected as it can be difficult to obtain a stable servo loop at a voltage significantly larger than Vcrit. The value of Vcrit varies as $\Omega^2$, so lowering the resonance frequency $\Omega$ of the proof mass can move operation of the accelerometer into the nano-g range by increasing the sensitivity, for example ±30 g.

A high performance accelerometer such as is described in WO 2005/083451 can cover a g range of ±50 g or ±75 g with an accuracy of +/−1 milli-g, which is adequate for certain military aerospace applications. In these devices the proof mass has a resonance frequency typically in the range of 1-3 kHz, which is relatively high, using approximately critical damping. The MEMS design limits the performance of the sensor to a noise figure of about 20 micro-g/root Hz. The damping is provided by air squeeze film damping with atmospheric pressure gas, such as argon or neon. For example, the Gemini accelerometer available from Silicon Sensing Systems Ltd. is a high performance dual-axis silicon MEMS accelerometer sensor having a dynamic range between ±0.85 g and ±96 g for different variants. The proof mass is formed by etching completely through the silicon, with typically 100 micron deep trenches into the silicon substrate. A limitation of the current MEMS design is the aspect ratio of the trenches defined by the depth over the gap, which is set to 20 for ease of manufacture. Thus for a substrate depth of 100 microns the minimum trench width is limited to 5 microns, which represents the lateral spacing between the interdigitated electrode fingers. This spacing limits the squeeze damping to a damping factor of about 1 for representative designs, which makes it difficult for the proof mass to have a low resonance frequency and low noise.

It would be desirable to reduce the resonance frequency $\Omega$ of a MEMS capacitive accelerometer so as to improve the bias performance, as the open loop gain is proportional to $1/\Omega^2$. If it is possible to reduce the resonance frequency, this increases the open loop sensitivity of the MEMS sensor to acceleration in terms of a capacitance change per g reducing noise and improving bias stability.

SUMMARY

According a first aspect of this disclosure there is provided a capacitive accelerometer comprising:

a substantially planar proof mass mounted to a fixed substrate by flexible support legs so as to be linearly moveable in an in-plane sensing direction in response to an applied acceleration;

the proof mass comprising first and second sets of moveable capacitive electrode fingers extending from the proof mass perpendicular to the sensing direction and laterally spaced in the sensing direction; first and second fixed capacitor electrodes comprising first and second sets of fixed capacitive electrode fingers extending perpendicular to the sensing direction and laterally spaced in the sensing direction;

the first set of fixed capacitive electrode fingers arranged to interdigitate with the first set of moveable capacitive electrode fingers of the proof mass, with a first offset in one direction from a median line to define a first lateral spacing therebetween, and the second set of fixed capacitive electrode fingers arranged to interdigitate with the second set of moveable capacitive electrode fingers of the proof mass, with a second offset in the opposite direction from a median line to define a second lateral spacing therebetween;

wherein the interdigitated capacitive electrode fingers are mounted in a gaseous medium that provides a damping effect counteracting relative displacement of the capacitive electrode fingers when the proof mass moves in response to an applied acceleration;

at least one further fixed capacitor electrode comprising a plurality of further fixed capacitive electrode fingers extending along the sensing direction;

the proof mass comprising a plurality of moveable capacitive electrode fingers extending from the proof mass along the sensing direction and arranged to interdigitate with the plurality of further fixed capacitive electrode fingers of the at least one further fixed capacitor electrode; and means for applying a voltage to the at least one further fixed capacitor electrode to apply an electrostatic force to the plurality of moveable capacitive electrode fingers that acts to pull the proof mass towards the at least one further fixed capacitor electrode and thereby reduces the first and/or second lateral spacings.

Thus in accordance with this disclosure the capacitive accelerometer includes a further fixed capacitor electrode to provide a further set of interdigitated capacitive electrode fingers extending along the sensing direction that can be used as "pull in" fingers. Applying a voltage to the further fixed capacitor electrode results in an electrostatic force acting between the interdigitated capacitive electrode fingers that can pull the proof mass toward the further fixed capacitor electrode in the sensing direction and thereby reduce the lateral spacings between the movable capacitive electrode fingers of the proof mass and the first and second sets of fixed capacitive electrode fingers that provide electrostatic forces for sensing purposes. An offset is required so that as the proof mass moves there is a change in the differential capacitance proportional to the displacement for sense and drive fingers. This means that the typical lateral spacing of 5-6 microns, as dictated by the aspect ratio of trenches fabricated in the silicon structure by etching processes such as DRIE, can be reduced to a much smaller gap of only 2-3 microns. The damping scales as the inverse cube of the size of the lateral gap, so reducing the currently achieved 6 micron gap to a 2 micron gap provides a 27 times increase in damping factor, for example from 1 to approximately 30, or from 1 to approximately 50 if the thickness of the proof mass is increased from 100 microns to 150 microns.

According to this disclosure, the lateral spacings between the two sets of capacitive electrode fingers is reduced by applying a voltage, such as a DC voltage, to the further fixed capacitor electrode. Where the proof mass output is at ground potential, a voltage is setup between the fixed "pull in" fingers of the further fixed capacitor electrode and the interdigitated fingers attached to the proof mass. This causes an attractive electrostatic force for both the first and second sets of interdigitated sensing fingers so that the first and second lateral spacings are both reduced. In a particular set of examples, the first and second lateral spacings are reduced by the same amount. The lateral spacing or gap between the interdigitated fingers is reduced equally for both the first and second sets of sensing electrodes, when there is the same potential for both sets and the same "pull in" electrostatic force experienced. When the whole proof mass moves under acceleration, in terms of the further set of "pull in" fingers, the lateral spacing of one set of sensing fingers increases in length while the lateral spacing of the other sets of sensing fingers decreases in length, so that the net electrostatic force from the further fixed "pull in" electrode is the same, regardless of the position of the proof mass. Thus the "pull in" electrostatic forces do not affect the resonance frequency of the proof mass. There is also a mechanical spring to couple the two halves of the proof mass (top and bottom) together, so that the proof mass assembly moves a single part under acceleration.

A benefit of reducing the lateral spacings and increasing the damping factor is that it enables the proof mass to have a lower resonance frequency while remaining stable in closed loop operation. The increased damping can stabilise the closed loop so that the proof mass is operating in the negative spring rate regime that applies at a resonance frequency of around 100 Hz. Analysis has shown that it is possible to stabilise the closed loop operation using the increased air squeeze film damping achieved with gaps pulled into the range of 2-3 microns. Thus in examples of this disclosure the proof mass may have a resonance frequency in the range of 100-500 Hz, for example 100-400 Hz, 100-300 Hz, or 100-200 Hz. A resonance frequency below 100 Hz may also be selected for certain applications. This is up to three times smaller than existing high performance MEMS accelerometers. A lower resonance frequency for the proof mass provides higher sensitivity and higher accuracy of bias. This can give a lower noise floor than previously known devices operating in the same g range. Thus the typical noise figure of 20 micro-g/root Hz can be reduced to approximately 25 nano-g/root Hz. The bias stability may also be improved by a similar ratio, from around 1 milli-g to around 1 micro-g. The higher damping does cause a higher Brownian motion noise which increases as square root (1/Q). However this increase is more than offset by the effect of the reduced resonance frequency.

It will be appreciated that the means for applying a voltage to the at least one further fixed capacitor electrode may be controllable so as to determine the reduction achieved in the first and second lateral spacings. For example, a voltage of 10-50 V DC may be applied depending on the pull in force desired. In examples of the present disclosure, the first and/or second lateral spacing may be reduced by at least 1 micron, 2 micron, 3 micron or 4 micron. In practice the voltage may be controlled so as to reduce the lateral spacings to any suitable size, but the minimum gap between electrode fingers may be limited by the typical magnitude of residual vibrations. For example, even a MEMS accelerometer operating in closed loop for an input range of ±30 g may experience, under a typical applied vibration of 8 g RMS, some residual movement up to 1 micron due to the limited bandwidth of the closed loop and the finite loop gain. Thus in some examples the lateral spacings may be reduced to no less than 1 micron. In other words, the lateral spacings may be reduced by up to 4 microns, e.g. relative to a conventional spacing of 6 microns. The voltage may therefore be controlled to reduce the lateral spacings taking into account the operational g range of the sensor and likely applied vibration. So as to ensure that the net electrostatic force from the further fixed pull in electrode is the same on both sets of sensing capacitive electrode fingers, the first and second lateral spacings may be reduced by the same amount.

It will be appreciated that the at least one further fixed capacitor electrode may take various different forms and may have several different possible arrangements relative to the proof mass. However, to help ensure that the further fixed capacitor electrode(s) applies an equal electrostatic force to the first and second sets of interdigitated electrode fingers that provide sensing for the proof mass, in one example the at least one further fixed capacitor electrode may comprise a fixed capacitor electrode arranged centrally of the proof mass. In such examples, the proof mass may comprise a first movable frame for the first set of interdigitated capacitive electrode fingers arranged on one side of the fixed capacitor electrode, and a second movable frame for the second set of interdigitated capacitive electrode fingers arranged on the opposite side of the fixed capacitor electrode.

In examples where the proof mass comprises first and second movable frames, the first and second movable frames may be connected by one or more springs. For example, the spring(s) may be arranged to span the further fixed capacitor electrode arranged centrally between the frames. The one or more springs may be suitably stiff, so that the frames can be pulled in towards the further fixed capacitor electrode against the spring force but are otherwise coupled together so as to move as one proof mass under external acceleration. In other words, the stiffness of the spring(s) may ensure that there is no relative movement between the first and the second frames in response to an applied acceleration. Thus the proof mass comprises the first and second movable frames moving as a single unit.

In another set of examples, the at least one further fixed electrode may comprise a pair of fixed capacitor electrodes with the proof mass being arranged centrally of the pair of fixed capacitor electrodes. In such examples, one of the pair of fixed capacitor electrodes may be arranged between the proof mass and the first set of interdigitated capacitive electrode fingers, and the other of the pair of fixed capacitor electrodes may be arranged between the proof mass and the second set of interdigitated capacitive electrode fingers. Where the proof mass is arranged centrally, a first movable frame for the first set of interdigitated capacitive electrode fingers may be connected to the proof mass by one or more first springs, and a second movable frame for the second set of interdigitated capacitive electrode fingers may be connected to the proof mass by one or more second springs. The first and second sets of springs may be arranged to span one or other of the pair of fixed capacitor electrodes.

In any of the examples disclosed above, the first and second movable frames of the proof mass may be suitably mounted to the fixed substrate by one or more anchors, for example at opposite ends of the substrate. In many examples of this disclosure, the proof mass and the fixed substrate may be integrally formed from a semiconductor substrate, for example a silicon substrate. The proof mass, for example comprising first and second movable frames, may be fabricated from the semiconductor substrate by an etching process such as deep reaction ion etching (DRIE). In a MEMS device, the proof mass and the fixed capacitor electrodes may be formed in the same plane as the fixed substrate. The fixed substrate may have a substantially rectangular ring-like shape, enclosing the proof mass. The first and second movable frames of the proof mass, where provided, may have a rectangular form.

The proof mass is suitably mounted to the fixed substrate by flexible support legs, which may be attached to anchors provided by the fixed substrate. The anchors may be fixably bonded, e.g. anodically bonded to an underlying electrically insulating support (for example glass). The flexible support legs set the resonance frequency of the proof mass and hence the sensitivity of the accelerometer. The proof mass may be mounted by a plurality of equally spaced flexible support legs, for example two or four support legs arranged around the proof mass. Where the proof mass takes the form of a substantially rectangular frame, the flexible support legs may be arranged at the four corners of the frame. Each support leg may extend in a direction substantially perpendicular to the sensing direction of the accelerometer so that when the proof mass moves in response to an applied acceleration the support legs flex and apply a restoring force urging the proof mass back towards a rest position. The shorter the support legs, the higher the resonance frequency of the proof mass. It is desirable to reduce the resonance frequency without significantly increasing the overall dimensions of the device. In a particularly suitable set of examples, the support legs have a serpentine form. Moreover it is disclosed that each support leg may comprise at least a first generally straight section, a second generally straight section, and an end section of generally U-shaped form interconnecting the first and second generally straight sections, wherein the thickness of the end section is greater than the thickness of a central part of both of the first and second generally straight sections. This construction of the support legs represents a particularly beneficial serpentine form with increased thickness for the end sections, which are most highly stressed in the event of a significant out-of-plane acceleration being applied. The support legs may have a serpentine form substantially as described in WO 2013/050752, the contents of which are hereby incorporated fully by reference.

The accelerometer may comprise any suitable gaseous medium to provide a damping effect for the interdigitated capacitive electrode fingers. The gaseous medium may comprise one or more of air, nitrogen, argon, helium or neon. It will be appreciated that applying a voltage to the further fixed capacitor electrode reduces the lateral spacings and increases the squeeze damping effect regardless of the pressure of the gaseous medium. The gaseous medium may therefore be contained at atmospheric pressure or at an elevated pressure. For example, the gaseous medium may be contained at a pressure up to about 10 bar.

In any of the examples disclosed herein, the capacitive accelerometer may take the form of a MEMS accelerometer, in particular a MEMS accelerometer formed from a semiconductor substrate, for example a silicon substrate. The fixed substrate and fixed capacitor electrodes, which may be etched from the same silicon substrate, may be anchored to an electrically insulating e.g. glass base that supports the semiconductor substrate. Anodic bonding may be used, as is well known in the art. Anodically bonding the semiconductor substrate to an electrically insulating e.g. glass base has the advantage of electrically isolating the capacitance of the interdigitated electrode fingers from the ground plane. Small capacitance changes are very important for the accuracy of an accelerometer.

As is mentioned above, the proof mass and the fixed capacitor electrodes (sensing and pull-in) may be formed by etching a semiconductor substrate. Each fixed capacitor electrode and its capacitive electrode fingers may take the form of a comb. For example, each of the first and second fixed capacitor electrodes may comprise a fixed electrode backbone extending along the sensing direction, orthogonal to the first and second sets of fixed capacitive electrode fingers. Similarly, the at least one further fixed (i.e. pull-in) capacitor electrode may have a backbone extending perpendicular to the sensing direction, orthogonal to the plurality of further fixed capacitive electrode fingers. The interdigitation of the fixed capacitive electrode fingers with the movable capacitive electrode fingers of the proof mass may be offset from a median line according to known arrangements, for example as disclosed by WO 2005/083451, the contents of which are hereby incorporated fully by reference.

According to a second aspect of this disclosure there is provided a method of controlling a capacitive accelerometer comprising:

a substantially planar proof mass mounted to a fixed substrate by flexible support legs so as to be linearly moveable in an in-plane sensing direction in response to an applied acceleration;

the proof mass comprising first and second sets of moveable capacitive electrode fingers extending from the proof mass perpendicular to the sensing direction and laterally spaced in the sensing direction;

first and second fixed capacitor electrodes comprising first and second sets of fixed capacitive electrode fingers extending perpendicular to the sensing direction and laterally spaced in the sensing direction;

the first set of fixed capacitive electrode fingers arranged to interdigitate with the first set of moveable capacitive electrode fingers of the proof mass, with a first offset in one direction from a median line to define a first lateral spacing therebetween, and the second set of fixed capacitive electrode fingers arranged to interdigitate with the second set of moveable capacitive electrode fingers of the proof mass, with a second offset in the opposite direction from a median line to define a second lateral spacing therebetween;

wherein the interdigitated capacitive electrode fingers are mounted in a gaseous medium that provides a damping effect counteracting relative displacement of the capacitive electrode fingers when the proof mass moves in response to an applied acceleration;

at least one further fixed capacitor electrode comprising a plurality of further fixed capacitive electrode fingers extending along the sensing direction; and the proof mass comprising a plurality of moveable capacitive electrode fingers extending from the proof mass along the sensing direction and arranged to interdigitate with the plurality of further fixed capacitive electrode fingers of the at least one further fixed capacitor electrode;

the method comprising:

applying a voltage to the at least one further fixed capacitor electrode to apply an electrostatic force to the plurality of moveable capacitive electrode fingers that acts to pull the proof mass towards the at least one further fixed capacitor electrode so as to reduce the first and/or second lateral spacings.

Examples of this method may comprise controlling the voltage so as to determine the reduction in the first and second lateral spacings. Applying a voltage to the at least one further fixed capacitor electrode may comprise applying a DC voltage, for example in the range of 10 to 50V. The method may comprise controlling the voltage so as to reduce the first and/or second lateral spacing by at least 1 µm, 2 µm, 3 µm or 4 µm. The voltage may be applied to the at least one further fixed capacitor electrode so as to apply an electrostatic force to the plurality of moveable capacitive electrode fingers so as to reduce the first and second lateral spacings by the same amount.

As is discussed hereinabove, the voltage level may be selected or adjusted depending on how far the lateral spacings are to be reduced so as to increase the damping effect of the gaseous medium.

The method may comprise operating the accelerometer open loop, for example in applications where a low bandwidth e.g. around 20 Hz may be appropriate. However in many examples it is suitable to operate the accelerometer under closed loop control conditions so that the proof mass does not move and only a restoring force proportional to the inertial force due to acceleration is present.

In a set of examples, the method comprises: applying in-phase and anti-phase pulse width modulation (PWM) drive signals to the first and second fixed capacitor electrodes; and operating in closed loop so that under an applied acceleration the mechanical inertial forces of the proof mass are balanced by electrostatic forces to maintain the proof mass at a null position. Furthermore the method may comprise: detecting an output signal from the accelerometer representing a displacement of the proof mass from the null position to provide an error signal; and using the error signal so as to vary the mark/space ratio of the PWM drive signals so that the accelerometer output signal (PMW mark/space ratio) is proportional to acceleration. The PWM drive signals may be square wave signals, for example as is generally known from WO 2004/076340 or WO 2005/083451.

BRIEF DESCRIPTION OF DRAWINGS

One or more non-limiting examples will now be described with reference to the accompanying drawings, in which:

FIG. 1a shows a prior art form of capacitive accelerometer 101 similar to that shown in WO 2005/083451. The accelerometer 101 has a proof mass 102 and four fixed electrodes 104, 106 arranged in two pairs on either side of the proof mass 102. The proof mass 102 is connected to multiple sets of moveable electrode fingers 108. These electrode fingers 108 are interdigitated in an offset manner with corresponding sets of fixed electrode fingers 110, 112 extending from the fixed electrodes 104, 106. The electrode fingers 108, 110, 112 are formed by etching trenches into a silicon substrate which is 100 microns thick. Proof mass 102 also has a set of support legs 114, which extend from the body of the proof mass and are fixed at anchor points 116. The minimum width of the trenches formed is set by the etching method, for example DRIE, and this sets further qualities such as the aspect ratio of the trenches and the minimum spacing between fingers. The proof mass 102 can move relative to the fixed electrodes 104, 106 in an in-plane sensing direction in response to an applied acceleration. The two sets of fixed electrode fingers 110, 112 are offset from the proof mass fingers 108 in opposite directions, such that a movement in either direction can be measured. These offsets may be equal in size. This offset is parallel to the sensing direction (indicated by the double headed arrow).

Figure 1A:
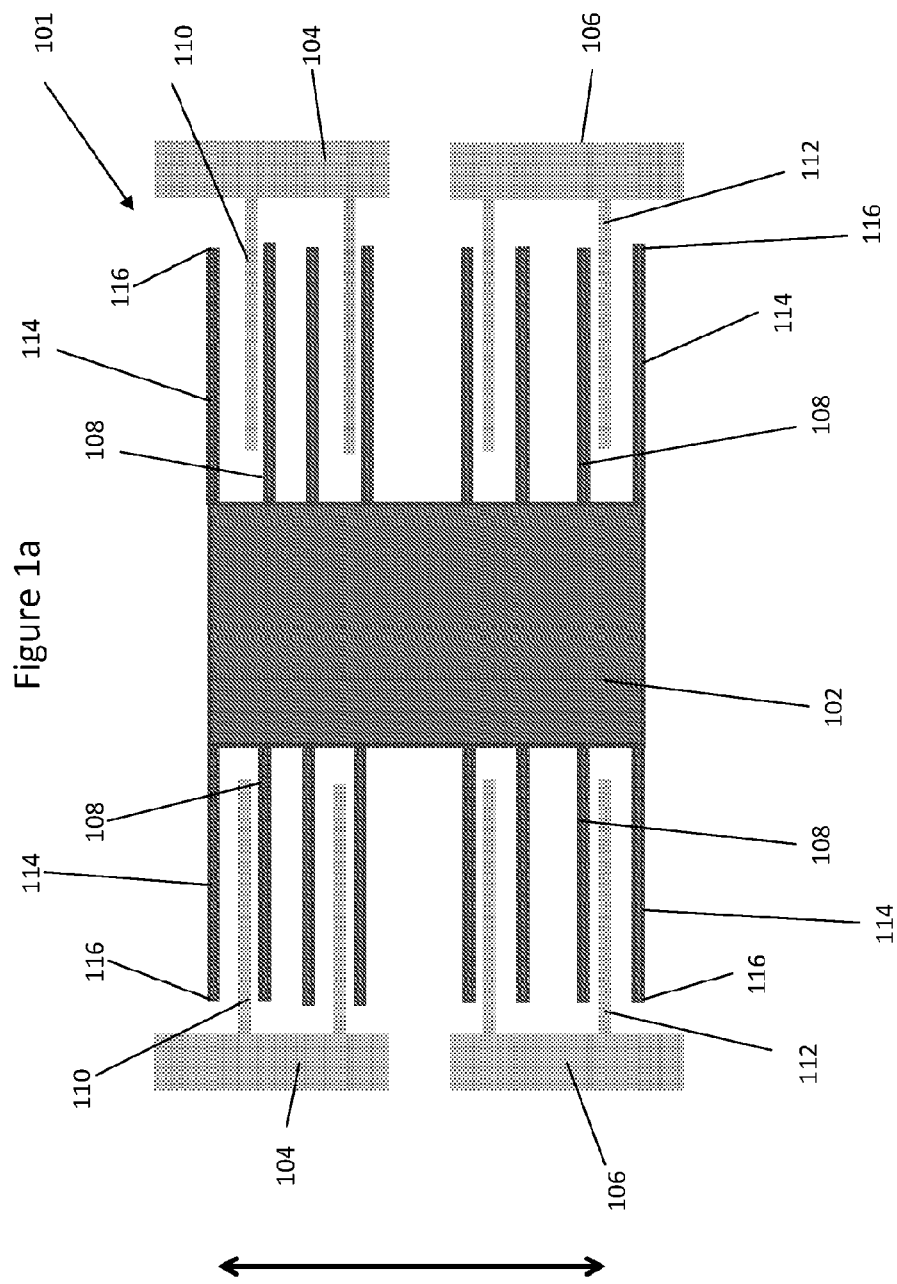
FIGS. 1a and 1b each show a prior art form of accelerometer.

The difference in offset for the first set of fingers 110 and the second set of fingers 112 relative to the moveable fingers 108 causes an attractive force when a voltage is applied. The fixed fingers 110, 112 can be controlled using a pulse width modulation (PWM) technique, in which an in-phase PWM signal is applied to one set of fingers 110, and an anti-phase PWM signal is applied to the other set of fingers 112. This allows the acceleration of the accelerometer to be measured, as the voltage applied allows a capacitive force feedback to null the proof mass 102 caused by an acceleration to be measured. An output signal is taken from the proof mass 102 to a charge amplifier representative of the displacement of the proof mass 102 from the null position. However, if there is a bias in the system caused by the proof mass 102 being offset from a neutral position while undergoing no acceleration, this will affect the measurements taken.

When the accelerometer 101 is used, acceleration will cause the proof mass 102 and its electrode fingers 108 to move in the sensing direction relative to the fixed electrodes 104, 106. In open loop operation, this causes a change in the offset between the proof mass fingers 108 and the fixed electrode fingers 110, 112. This change can be used to calculate the acceleration, as it will cause a change in the differential capacitance of the system. In a closed loop system, the fingers do not actually move relative to one another. An electrostatic restoring force is applied to the fingers 108 so that under acceleration the proof mass 102 does not move, with its inertial forces being balanced by electrostatic forces. When using a PWM approach, the electrostatic force is proportional to the mark/space ratio, which gives a linear output. The size of the restoring force required to maintain the fingers in a fixed position can be used to calculate the force on the proof mass 102, and therefore the acceleration of the accelerometer 101. The acceleration can only be measured in the sensing direction, i.e. perpendicular to the fingers 108, 110, 112, as it is the movement of these fingers changing the relative offset which allows the acceleration to be measured.

Due to the methods used to etch the electrode fingers 108, 110, 112, the gap between adjacent fingers is approximately 6 microns. The trenches etched to form the fingers have an aspect ratio of 20 due to manufacturing methods, putting further limitations on the size and shape of the fingers. This limitation on the trench size causes a limitation on the damping of the accelerometer 101, limiting the damping factor to approximately 1. The damping is provided by atmospheric pressure gas, such as argon or neon. Having such a low damping factor makes it difficult to set a low resonance frequency, so such an accelerometer 101 typically has a resonance frequency of about 3 kHz. However, this resonance frequency needs to be reduced in order to improve the bias performance of the accelerometer 101.

Figure 1B:
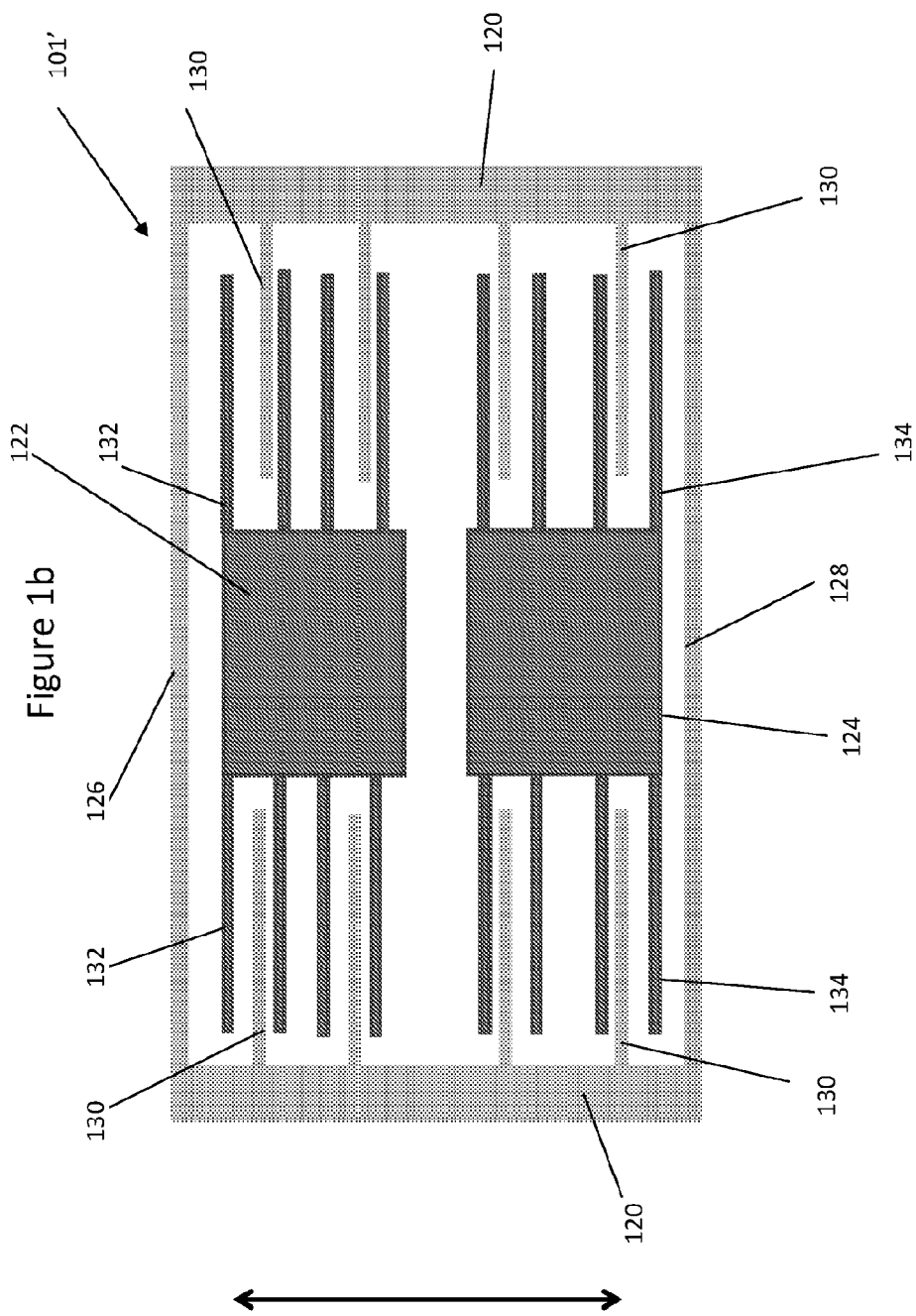

FIG. 1b shows an alternative form of prior art accelerometer. Here, the proof mass 120 takes the form of an outer frame of the accelerometer, with the fixed electrodes 122, 124 being internal to the frame. This is a reversal of the arrangement of FIG. 1a. The proof mass frame 120 is anchored at two central points 126, 128, above and below the fixed electrodes 122, 124. Extending from the frame 120 are a number of moveable electrode fingers 130, which are interdigitated with fixed electrode fingers 132, 134 extending from the fixed electrodes 122, 124 in an offset manner. As in FIG. 1a, electrode fingers 130, 132, 134 are offset parallel to the sensing direction (shown by the double headed arrow), by approximately the same distance but in opposite directions. The gap between adjacent fingers is approximately 6 microns as previously, due to the etching methods used.

This form of prior art accelerometer functions in a similar manner to that of FIG. 1a. The fixed electrode fingers 132, 134 can be split into first and second electrodes, with offset differences causing an attractive force when a voltage is applied. PWM techniques can be used to control the fingers 132, 134, as previously, allowing the acceleration of the accelerometer 101' to be measured, as the voltage applied allows a capacitive force caused by an acceleration to be measured. As with FIG. 1a, if there is a bias in the system caused by the proof mass 120 being offset from a neutral position while undergoing no acceleration, this will affect the measurements taken. In addition, damping due to atmospheric pressure gas for a finger spacing of 6 microns is limited so the accelerometer has a resonance frequency of 3 kHz, which must be reduced in order to improve the bias performance.

Figure 2:
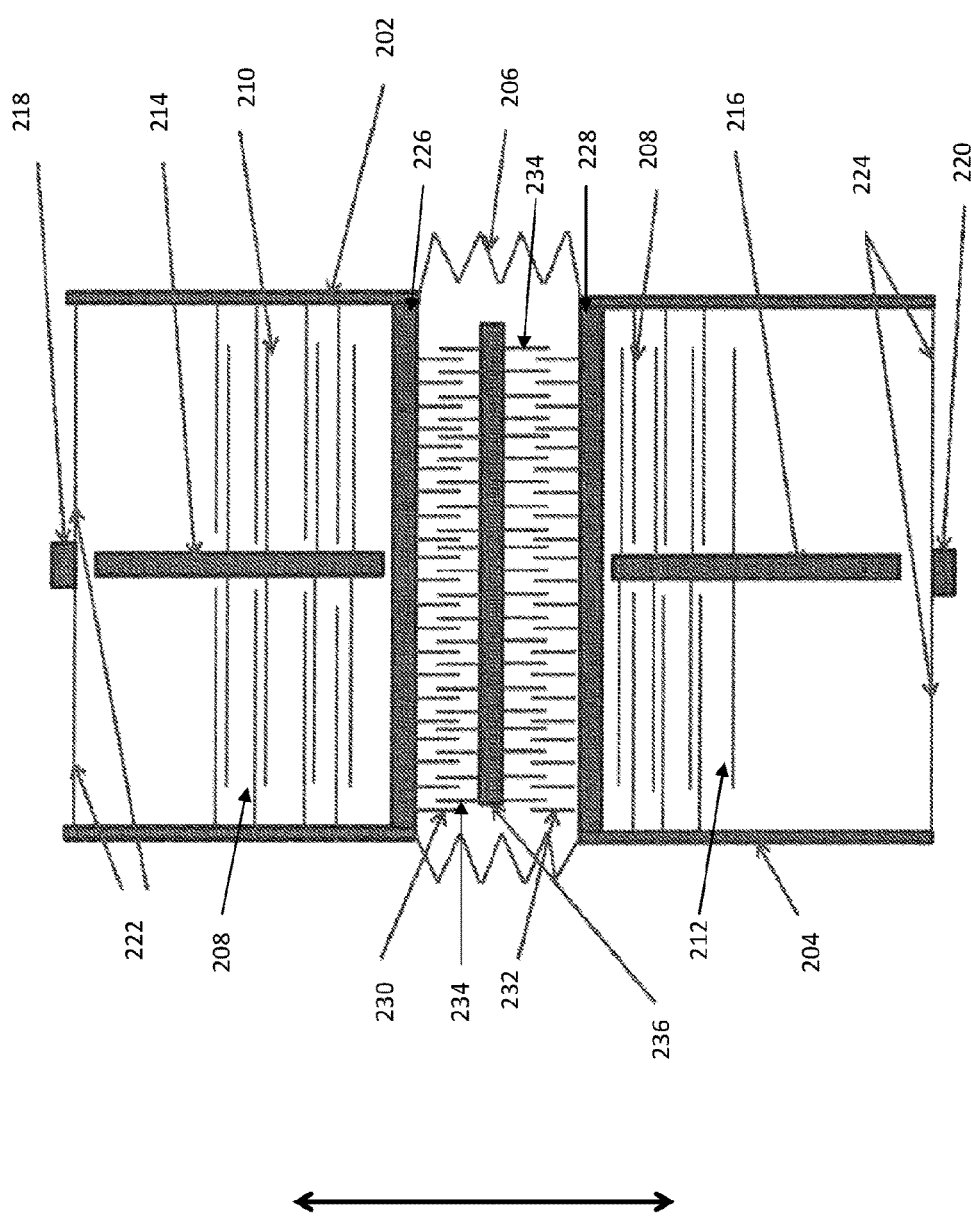
FIG. 2 shows an exemplary accelerometer in accordance with this disclosure.

FIG. 2 shows an accelerometer in accordance with the present disclosure. In this example, the proof mass comprises an upper frame 202 and lower frame 204, connected by a plurality of springs 206. These springs 206 are stiff enough that the upper frame 202 and lower frame 204 move together in the sensing direction in response to an applied acceleration. A number of moveable fingers 208 are formed to extend perpendicular to the sensing direction from the upper and lower frames 202, 204. These fingers 208 are interdigitated with two sets of fixed electrode fingers 210, 212 which extend from an upper fixed electrode 214 and a lower fixed electrode 216. The upper and lower sets of interdigitated electrode fingers form a mirror image of one another. The upper and lower frames 202, 204 are mounted by support legs 222, 224, which terminate at anchor points 218, 220. These anchor points 218, 220 connect the frames 202, 204 to a supporting glass substrate (not shown). The support legs 222, 224 are flexible so as to allow the proof mass to move relative to the supporting substrate in response to an applied acceleration, in the sensing direction as indicated by a double-headed arrow. The length, width and configuration of the support legs 222, 224 determines the resonance frequency of the proof mass. The legs may have a serpentine form, for example as disclosed by WO 2013/050752, to reduce the resonance frequency to less than 500 Hz.

At the opposite end of the frames 202, 204 are frame bases 226, 228. Attached to these frame bases 226, 228 are a plurality of moveable pull-in fingers 230, 232. These pull-in fingers 230, 232 are parallel to the sensing direction of the accelerometer. They are interdigitated with a set of fixed pull-in fingers 234, which are present above and below a central fixed electrode 236. This central fixed electrode 236 and the upper and lower fixed electrodes 214, 216 are anodically bonded to the glass substrate (not shown).

The moveable electrode fingers 208 are offset by a distance δ from the median line between two adjacent fixed electrode fingers 210, 212 of the same set (spaced apart by 2 D), such that each moveable electrode finger 208 is at a position D-δ from one adjacent finger, and D+δ from the other adjacent finger. This offset δ is mirrored between the upper and lower sets of fixed electrode fingers that interdigitate with the moveable electrode fingers 208 of the proof mass. The pull-in fingers 230, 232, 234 are all equally spaced, rather than being offset.

In use, a DC voltage is applied to the fixed pull-in fingers 234, which causes the moveable pull-in fingers 230, 232 to move closer together, decreasing the gap between the frame bases 226, 228. The upper and lower frames 202, 204 are both pulled in equally as the same force is applied to both sets of pull-in fingers, and continue to move as one proof mass. As capacitance is proportional to length, the amount by which the frames 202, 204 are pulled in is changed by the magnitude of the DC voltage applied. Typically, the voltage is between 10 and 50 V DC, depending on the finger arrangement and the desired pull-in. The pull-in is limited by the residual motion of the fingers 230, 232, 234 caused by vibration of the proof mass, and by the acceleration range which the user wishes to measure. The gap between frames 202, 204 can be reduced to a greater degree if the range of g-forces the accelerometer must measure is reduced. By reducing the gap between the frames 202, 204, it becomes possible to use lower resonance frequencies at similar sensitivity. This is because by reducing the gap between adjacent interdigitated fingers to 2-3 microns, rather than 6 microns as in prior art systems such as FIG. 1, the damping of the system is increased. This allows a lower resonance frequency to be used without increasing the noise levels. In addition, it may be possible to use atmospheric pressure gas to cause damping of the system, stabilising the system while it is in the negative spring rate regime (voltage above Vcrit). It is possible to reduce the effect of bias in the system, as the pull-in voltage can be adjusted to compensate from any shift in the frame 202, 204 from its neutral position. In addition, by reducing the size of the gap between the frames 202, 204, the sensitivity and capacitance of the accelerometer both increase, increasing the output signal, which is generated by the frames 202, 204. A proof mass formed of frames 202, 204 such as this can then operate as is known in the art of accelerometers, for example as explained with reference to FIGS. 1a and 1b, moving when the accelerometer accelerates and changing the distance between the interdigitated fingers 208, 210, 212 or the restoring force required to keep the offset constant. The force required or caused by the capacitance can then be used to calculate the acceleration undergone by the accelerometer.

Figure 3:
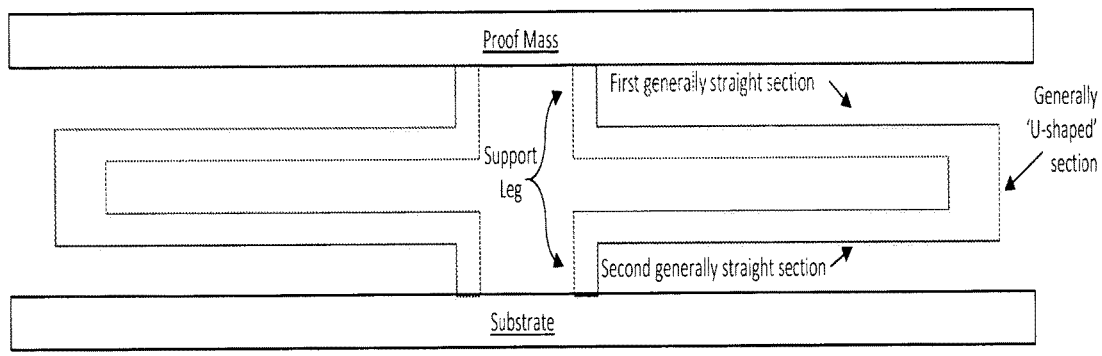
FIG. 3 shows a proof mass mounted to a fixed substrate according to one embodiment.

As shown in FIG. 3, the proof mass is suitably mounted to the fixed substrate by flexible support legs, which may be attached to anchors provided by the fixed substrate. Each support leg may extend in a direction substantially perpendicular to the sensing direction of the accelerometer so that when the proof mass moves in response to an applied acceleration the support legs flex and apply a restoring force urging the proof mass back towards a rest position. The shorter the support legs, the higher the resonance frequency of the proof mass. It is desirable to reduce the resonance frequency without significantly increasing the overall dimensions of the device. In a particularly suitable set of examples, the support legs have a serpentine form. Moreover it is disclosed that each support leg may comprise at least a first generally straight section, a second generally straight section, and an end section of generally U-shaped form interconnecting the first and second generally straight sections, wherein the thickness of the end section is greater than the thickness of a central part of both of the first and second generally straight sections. This construction of the support legs represents a particularly beneficial serpentine form with increased thickness for the end sections, which are most highly stressed in the event of a significant out-of-plane acceleration being applied.

The invention claimed is:

1. A capacitive accelerometer comprising:
a substantially planar proof mass mounted to a fixed substrate by flexible support legs so as to be linearly moveable in an in-plane sensing direction in response to an applied acceleration;
the proof mass comprising first and second sets of moveable capacitive electrode fingers extending from the proof mass perpendicular to the sensing direction and laterally spaced in the sensing direction;
first and second fixed capacitor electrodes comprising first and second sets of fixed capacitive electrode fingers extending perpendicular to the sensing direction and laterally spaced in the sensing direction;
the first set of fixed capacitive electrode fingers arranged to interdigitate with an offset with the first set of moveable capacitive electrode fingers of the proof mass, with a first offset in one direction from a median line to define a first lateral spacing therebetween, and the second set of fixed capacitive electrode fingers arranged to interdigitate with the second set of moveable capacitive electrode fingers of the proof mass, with a second offset in the opposite direction from a median line to define a second lateral spacing therebetween;
wherein the interdigitated capacitive electrode fingers are mounted in a gaseous medium that provides a damping effect counteracting relative displacement of the capacitive electrode fingers when the proof mass moves in response to an applied acceleration;
at least one further fixed capacitor electrode comprising a plurality of further fixed capacitive electrode fingers extending along the sensing direction;
the proof mass comprising a plurality of moveable capacitive electrode fingers extending from the proof mass along the sensing direction and arranged to interdigitate with the plurality of further fixed capacitive electrode fingers of the at least one further fixed capacitor electrode; and
means for applying a voltage to the at least one further fixed capacitor electrode to apply an electrostatic force to the plurality of moveable capacitive electrode fingers that acts to pull the proof mass towards the at least one further fixed capacitor electrode and thereby reduces the first and/or second lateral spacings;
wherein the least one further fixed capacitor electrode comprises a fixed capacitor electrode arranged centrally of the proof mass; and
wherein the proof mass comprises a first moveable frame for the first set of interdigitated capacitive electrode fingers arranged on one side of the fixed capacitor electrode and a second moveable frame for the second set of interdigitated capacitive electrode fingers arranged on an opposite side of the fixed capacitor electrode.

2. An accelerometer according to claim 1, wherein the means for applying a voltage to the at least one further fixed capacitor electrode is controlled so as to reduce the first and/or second lateral spacing by at least 1 μm, 2 μm, 3 μm or 4 μm.

3. An accelerometer according to claim 1, wherein the first and second lateral spacings are reduced by a same amount.

4. An accelerometer according to claim 1, wherein the first and second moveable frames are connected by one or more springs.

5. An accelerometer according to claim 1, wherein the proof mass is mounted to the fixed substrate by a plurality of flexible support legs having a serpentine form.

6. An accelerometer according to claim 5, wherein each support leg comprises at least a first generally straight section, a second generally straight section, and an end section of generally U-shaped form interconnecting the first and second generally straight sections, wherein the thickness of the end section is greater than the thickness of a central part of both of the first and second generally straight sections.

7. An accelerometer according to claim 1, wherein the proof mass has a resonance frequency in the range of 100-500 Hz, 100-400 Hz, 100-300 Hz, or 100-200 Hz.

8. An accelerometer according to claim 1, wherein the accelerometer is a MEMS accelerometer.

9. A method of controlling a capacitive accelerometer comprising:
- a substantially planar proof mass mounted to a fixed substrate by flexible support legs so as to be linearly moveable in an in-plane sensing direction in response to an applied acceleration;
- the proof mass comprising first and second sets of moveable capacitive electrode fingers extending from the proof mass perpendicular to the sensing direction and laterally spaced in the sensing direction;
- first and second fixed capacitor electrodes comprising first and second sets of fixed capacitive electrode fingers extending perpendicular to the sensing direction and laterally spaced in the sensing direction;
- the first set of fixed capacitive electrode fingers arranged to interdigitate with the first set of moveable capacitive electrode fingers of the proof mass, with a first offset in one direction from a median line to define a first lateral spacing therebetween, and the second set of fixed capacitive electrode fingers arranged to interdigitate with the second set of moveable capacitive electrode fingers of the proof mass, with a second offset in the opposite direction from a median line to define a second lateral spacing therebetween;
- wherein the interdigitated capacitive electrode fingers are mounted in a gaseous medium that provides a damping effect counteracting relative displacement of the capacitive electrode fingers when the proof mass moves in response to an applied acceleration;
- at least one further fixed capacitor electrode comprising a plurality of further fixed capacitive electrode fingers extending along the sensing direction; and
- the proof mass comprising a plurality of moveable capacitive electrode fingers extending from the proof mass along the sensing direction and arranged to interdigitate with the plurality of further fixed capacitive electrode fingers of the at least one further fixed capacitor electrode;
- wherein the least one further fixed capacitor electrode comprises a fixed capacitor electrode arranged centrally of the proof mass; and
- wherein the proof mass comprises a first moveable frame for the first set of interdigitated capacitive electrode fingers arranged on one side of the fixed capacitor electrode and a second moveable frame for the second set of interdigitated capacitive electrode fingers arranged on an opposite side of the fixed capacitor electrode;

the method comprising:
applying a voltage to the at least one further fixed capacitor electrode to apply an electrostatic force to the plurality of moveable capacitive electrode fingers that acts to pull the proof mass towards the at least one further fixed capacitor electrode so as to reduce the first and/or second lateral spacings.

10. A method according to claim 9, comprising: controlling the voltage so as to reduce the first and/or second lateral spacing by at least 1 µm, 2 µm, 3 µm or 4 µm.

11. A method according to claim 9, comprising: applying said voltage to the at least one further fixed capacitor electrode so as to apply an electrostatic force to the plurality of moveable capacitive electrode fingers so as to reduce the first and second lateral spacings by a same amount.

12. A method according to claim 9, further comprising:
- applying in-phase and anti-phase pulse width modulation (PWM) drive signals to the first and second fixed capacitor electrodes; and
- operating in closed loop so that mechanical inertial forces are balanced by electrostatic forces to maintain an operating point of the proof mass at a null position.

13. A method according to claim 9, further comprising:
- detecting an output signal from the accelerometer representing a displacement of the proof mass from a null position to provide an error signal; and
- using the error signal so as to vary a mark/space ratio of PWM drive signals so that the accelerometer output signal is proportional to acceleration.

* * * * *